(12) United States Patent
Shin et al.

(10) Patent No.: US 9,658,949 B2
(45) Date of Patent: May 23, 2017

(54) TEST SYSTEM OF SYSTEM ON CHIP AND TEST METHOD THEREOF

(71) Applicant: SAMSUNG ELECTRONICS CO., LTD., Suwon-si (KR)

(72) Inventors: Manyoung Shin, Seongnam-si (KR); Janghyuk An, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 132 days.

(21) Appl. No.: 14/622,185

(22) Filed: Feb. 13, 2015

(65) Prior Publication Data

US 2015/0234737 A1    Aug. 20, 2015

Related U.S. Application Data

(60) Provisional application No. 61/939,927, filed on Feb. 14, 2014.

(30) Foreign Application Priority Data

Jun. 9, 2014  (KR) ........................ 10-2014-0069370

(51) Int. Cl.
  G06F 11/00   (2006.01)
  G06F 11/36   (2006.01)
  G06F 11/263  (2006.01)
  G01R 31/28   (2006.01)

(52) U.S. Cl.
  CPC ...... *G06F 11/3692* (2013.01); *G01R 31/2868* (2013.01); *G06F 11/263* (2013.01)

(58) Field of Classification Search
  CPC  G06F 11/263; G06F 11/3692; G01R 31/2868
  See application file for complete search history.

(56) References Cited

U.S. PATENT DOCUMENTS

| | | | | |
|---|---|---|---|---|
| 4,696,578 A | * | 9/1987 | Mansuria | G01N 25/18 257/E21.53 |
| 6,323,663 B1 | * | 11/2001 | Nakata | G01R 1/0491 324/756.03 |
| 6,593,761 B1 | * | 7/2003 | Fukasawa | G01R 31/2868 324/750.13 |
| 6,774,661 B1 | * | 8/2004 | Tustaniwskyj | G01R 31/2868 324/750.09 |
| 2002/0109518 A1 | * | 8/2002 | Saito | G01R 1/0458 324/750.09 |

(Continued)

*Primary Examiner* — Joshua P Lottich
(74) *Attorney, Agent, or Firm* — Sughrue Mion, PLLC

(57) ABSTRACT

A test system method for testing software of each of a plurality of system on chips (SoCs) are provided. The test system includes: a plurality of test units configured to test the plurality of SoCs according to a plurality of test cases, respectively; a power supplier configured to supply, to each of the plurality of test units, power of a level corresponding to a corresponding test case, among the plurality of test cases; a temperature controller configured to provide, to each of the plurality of test units, a temperature control signal according to the corresponding test case, and to monitor a measurement temperature, provided from each of the plurality of test units, of each of the plurality of SoCs; and an analyzer configured to analyze at least one of a driving voltage, a driving current, and a driving frequency of each of the plurality of SoCs.

20 Claims, 11 Drawing Sheets

(56) References Cited

U.S. PATENT DOCUMENTS

| | | | |
|---|---|---|---|
| 2003/0137317 A1* | 7/2003 | Kim | G01R 31/2868 324/750.03 |
| 2003/0151421 A1* | 8/2003 | Leedy | G01R 1/07307 324/750.05 |
| 2004/0080311 A1* | 4/2004 | Kim | G01R 31/2862 324/750.14 |
| 2005/0099173 A1* | 5/2005 | Siade | G01R 31/2874 324/757.05 |
| 2005/0166103 A1* | 7/2005 | Gupta | G06F 11/3471 714/718 |
| 2005/0235263 A1* | 10/2005 | Bundy | G06F 11/263 717/124 |
| 2006/0186909 A1* | 8/2006 | Aube | G01R 31/2875 324/750.09 |
| 2007/0239386 A1* | 10/2007 | Capps, Jr. | G01R 31/2868 702/117 |
| 2009/0112548 A1* | 4/2009 | Conner | G01R 31/31917 703/13 |
| 2012/0233504 A1* | 9/2012 | Patil | G06F 11/2242 714/30 |
| 2012/0238042 A1* | 9/2012 | Ossimitz | G01R 1/0408 438/14 |
| 2013/0073907 A1* | 3/2013 | Han | G01R 31/31858 714/32 |
| 2013/0283238 A1 | 10/2013 | Levi | |

\* cited by examiner

FIG. 10

| Test Class | Verifying content | Number of TC | Required time |
|---|---|---|---|
| Pattern DVFS | Test voltage level variation with CPU frequency | 4 | 40 min |
| Voltage/Current /Freq. | Voltage/Current/Frequency of AP according to each of Test Scenario | 1 | 20 min |
| Function Test | Verifying IP's of the AP | 17 | 60 min |
| Stability | Booting, Audio & video playing, Monkey, File system, Little/big switching, memory test, camera test, etc | 7 | 90 min |
| Benchmark | Performance of CPU, Memory, Graphic, File system | 4 | 30 min |

TEST SYSTEM OF SYSTEM ON CHIP AND TEST METHOD THEREOF

CROSS-REFERENCE TO RELATED APPLICATIONS

This U.S. non-provisional patent application claims the benefit of U.S. Provisional Patent Application No. 61/939,927, filed on Feb. 14, 2014, and claims priority to Korean Patent Application No. 10-2014-0069370, filed on Jun. 9, 2014 in the Korean Intellectual Property Office (KIPO), the entire contents of which are hereby incorporated by reference.

BACKGROUND

Apparatuses and methods consistent with exemplary embodiments relate to a test system, and more particularly, to a test system capable of testing a plurality of system on chips at the same time and a test method thereof.

An application specific integrated circuit (ASIC) technology has been developed from a chip set system to a concept of a system on chip (SoC) based on a core being built in one chip. A SoC includes various intellectual properties such as a micro processor, an interface, a memory, and a digital signal processor (DSP). An example of a SoC is an application processor (AP). Various electrical and physical properties are tested to determine whether an AP is defective or not from a wafer level process. Even after a packaging process of an AP is completed, it is verified whether the AP is defective or not through various tests.

An AP mounted in mobile devices such as a smart phone or a tablet personal computer (PC) has to be tested to determine whether its various functions operate normally under an operating system (OS) to be actually driven, besides a general electrical characteristic. In the case of an embedded system such as a SoC, it is well known that a cause of system failure may be based on software rather than hardware. Thus, a test technology for software (e.g., an operating system or an application program) of a SoC such as an AP is needed. In this regard, a test technology is needed for a system that tests a hardware response while testing whether a normal operation is performed with respect to software. There is a growing demand for an automated test system that automatically sets various test cases occurring in a software operating status and detects whether the software is defective or not by applying each test case to an AP.

SUMMARY

Aspects of one or more exemplary embodiments provide a test system and method for testing a plurality of system on chips.

According to an aspect of an exemplary embodiment, there is provided a test system for testing a plurality of system on chips, the test system including: a plurality of test units configured to test the plurality of system on chips according to a plurality of test cases, respectively; a power supplier configured to supply, to each of the plurality of test units, power of a level corresponding to a corresponding test case, among the plurality of test cases; a temperature controller configured to provide, to each of the plurality of test units, a temperature control signal according to the corresponding test case, and to monitor a measurement temperature, provided from each of the plurality of test units, of each of the plurality of system on chips; and an analyzer configured to analyze at least one of a driving voltage, a driving current, and a driving frequency of each of the plurality of system on chips, provided from each of the plurality of test units, wherein each of the plurality of test units determines whether software driven in any of the plurality of system on chips is defective based on respective test results with respect to the plurality of system on chips.

According to an aspect of another exemplary embodiment, there is provided a test system for testing software of a plurality of system on chips, the test system including: a plurality of test units configured to test the plurality of system on chips, respectively, by independently applying a plurality of test cases, wherein each of the plurality of test units includes: a target board including a system on chip, among the plurality of system on chips, being tested; a cutter configured to regulate power, supplied to the test unit, according to a corresponding test case among the plurality of applied test cases, and to provide the regulated power to the system on chip through the target board; and a test controller configured to control a regulating operation of the cutter according to the corresponding test case, and to exchange data with the system on chip through the cutter.

According to an aspect of another exemplary embodiment, there is provided a method for testing software of each of a plurality of system on chips, the test method including: applying a plurality of test cases to independently test each of the plurality of system on chips; performing, for each of the plurality of system on chips according to the applied plurality of test cases, at least one of a dynamic voltage and frequency scaling (DVFS) test, an operation test of function blocks of a system on chip, among the plurality of system on chips, a stability test, a data exchange test through one or more interfaces, and a temperature test, while software of each of the plurality of system on chips is driven; and obtaining a plurality of test results for the plurality of system on chips, respectively.

BRIEF DESCRIPTION OF THE FIGURES

Exemplary embodiments will be more clearly understood from the following detailed description taken in conjunction with the accompanying drawings in which:

FIG. 10 is a table illustrating test cases being applied to a software test with respect to one application processor in a test system in accordance with an exemplary embodiment.

DETAILED DESCRIPTION OF EXEMPLARY EMBODIMENTS

Figure 1:
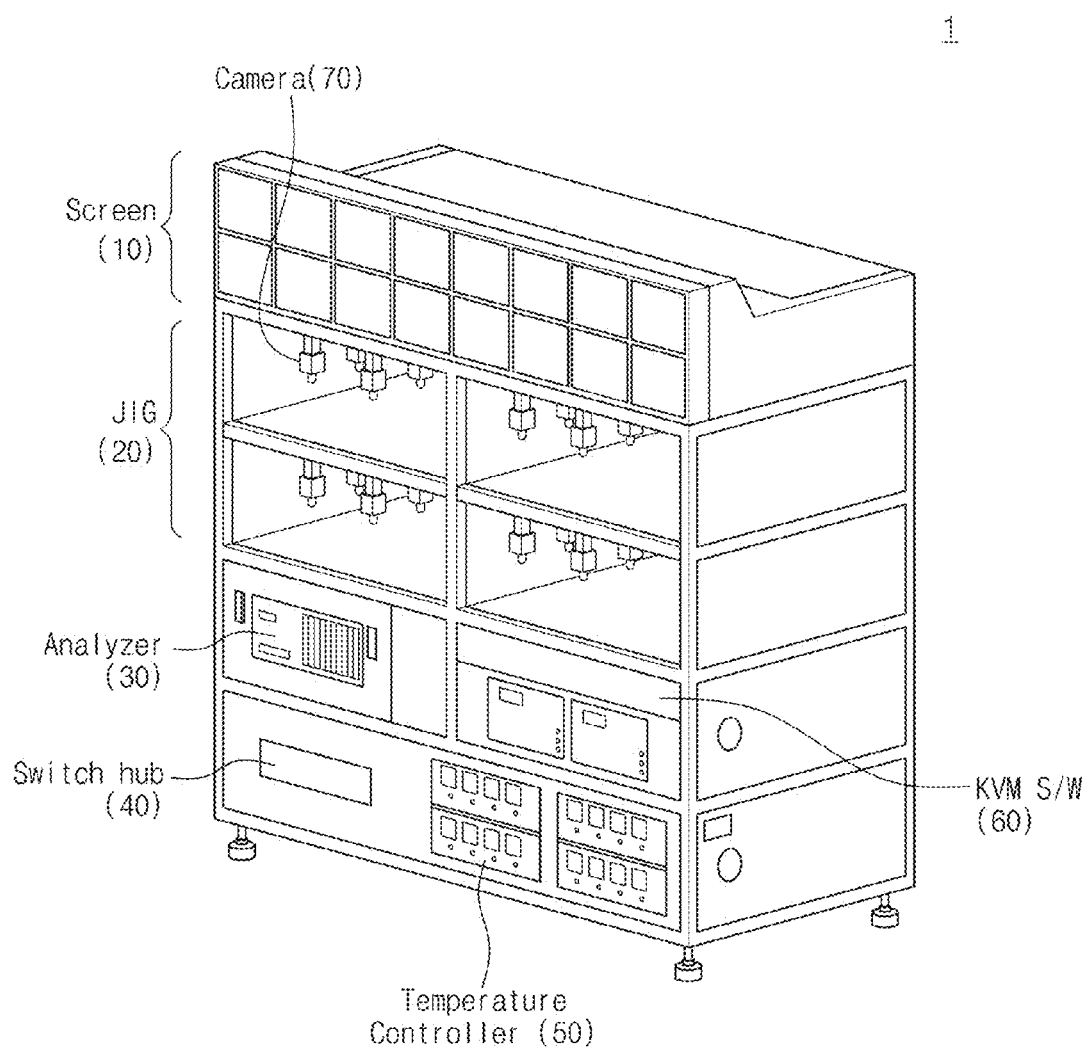
FIG. 1 is a drawing illustrating the appearance of a test device in accordance with an exemplary embodiment.

Exemplary embodiments will be described more fully hereinafter with reference to the accompanying drawings. An exemplary embodiment may, however, be embodied in many different forms and should not be construed as limited to exemplary embodiments set forth herein. Rather, these exemplary embodiments are provided so that this disclosure will be thorough and complete, and will fully convey the scope of the inventive concept to those skilled in the art. In the drawings, the size and relative sizes of layers and regions may be exaggerated for clarity. Like numbers refer to like elements throughout.

The terminology used herein is for the purpose of describing particular exemplary embodiments only and is not intended to be limiting of exemplary embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Furthermore, expressions such as "at least one of," when preceding a list of elements, modify the entire list of elements and do not modify the individual elements of the list.

FIG. 1 is a drawing illustrating the appearance of a test device 1 in accordance with an exemplary embodiment. Referring to FIG. 1, a test device 1 includes a screen unit 10 (e.g., screen, display, etc.) showing a test state and a display state of each application processor (AP) in which a software test is performed, a JIG unit 20, an analyzer 30, a switch hub 40, a temperature control unit 50 (e.g., temperature controller), and a keyboard, video, and mouse (KVM) switch 60.

While exemplary embodiments described herein are with respect to an AP, it is understood that one or more other exemplary embodiments are not limited thereto. That is, it is understood that the AP described herein is an example of a system on chip (SoC), and one or more other exemplary embodiments may be applicable to other types of SoCs.

The screen unit 10 is connected to the JIG unit 20 to display a test state of each AP in which a test is performed. That is, whether a test is performed and a test result (e.g., pass/fail) with respect to each AP under test, as well as a display screen being displayed by a corresponding AP, may appear on or be displayed by the screen unit 10. Accordingly, a user (e.g., manager) can check whether an AP is defective or not with reference to a test result that appears on the screen unit 10. In the case of a software defect that is difficult to be detected mechanically, it may be judged or determined whether the software defect occurs with reference to a display state that an AP drives being displayed on the screen unit 10. A display screen that an AP drives or that corresponds to an AP may be provided to the screen unit 10 through, for example, one or more cameras 70 separately assigned to each of the APs.

The JIG unit 20 provides an electrical connection between a target board on which an AP that is a test target is mounted and the screen unit 10, the analyzer 30, the switch hub 40, the temperature controller 50, and the KVM switch 60. The JIG unit 20 connects all the input/output ports (e.g., -Definition Multimedia Interface (HDMI), Universal Serial Bus (USB), an audio jack, a power input, etc.) of a target board to all the control devices performing a test. By way of example, cameras 70 for capturing a display connected to each target board to provide the captured display to the screen unit 10 may be located in or near the JIG unit 20, e.g., on the top of the JIG unit 20.

The analyzer 30 is provided with electrical characteristics (e.g., all the electrical characteristics) of an AP in which software is being driven or executed. The analyzer 30 can analyze power consumption or the degree of load by detecting a driving voltage, a frequency, a current, etc., of an AP being detected from the target board. The analyzer 30 can analyze power consumption and an operation characteristic according to a temperature by detecting at least one of a driving voltage, a frequency, a current, etc., of an AP under a specific temperature condition.

The switch hub 40 mediates between test controller or a test control personal computer (PC) independently performing a test case (TC) on each AP that is a test target and the analyzer 30, the temperature controller 50, and the KVM switch 60. A test device 1 to be connected to a test management server that can check a test result on all the APs through the switch hub 40 may be connected to the switch hub 40.

The temperature controller 50 can change a temperature of an AP through a temperature control element, e.g., a heating element, built or included in or near a target board according to a specific test case. For example, to provide various temperature environments in which an AP may be driven, the temperature controller 50 can control a heating element included in a socket of the target board. In addition, the temperature controller 50 can measure a temperature of an AP through a temperature sensor built or included in or near the target board.

The KVM switch 60 is a switch for consolidating a basic input/output device of a test controller or a test control PC controlling each of target boards being built or included in the test device 1 into at least one keyboard, mouse, and monitor. By the KVM switch 60, a manager can control an operation of an AP in which defects occur or direct its test to stop.

Test controllers or test control PCs for controlling target boards are built or included in or near the test device 1, e.g., in a rear end of the test device 1. A test case can be independently applied to each AP being tested by the test control PCs. A test result is judged or determined by the test control PC and the judged test result may be displayed on the screen unit 10.

Figure 2:
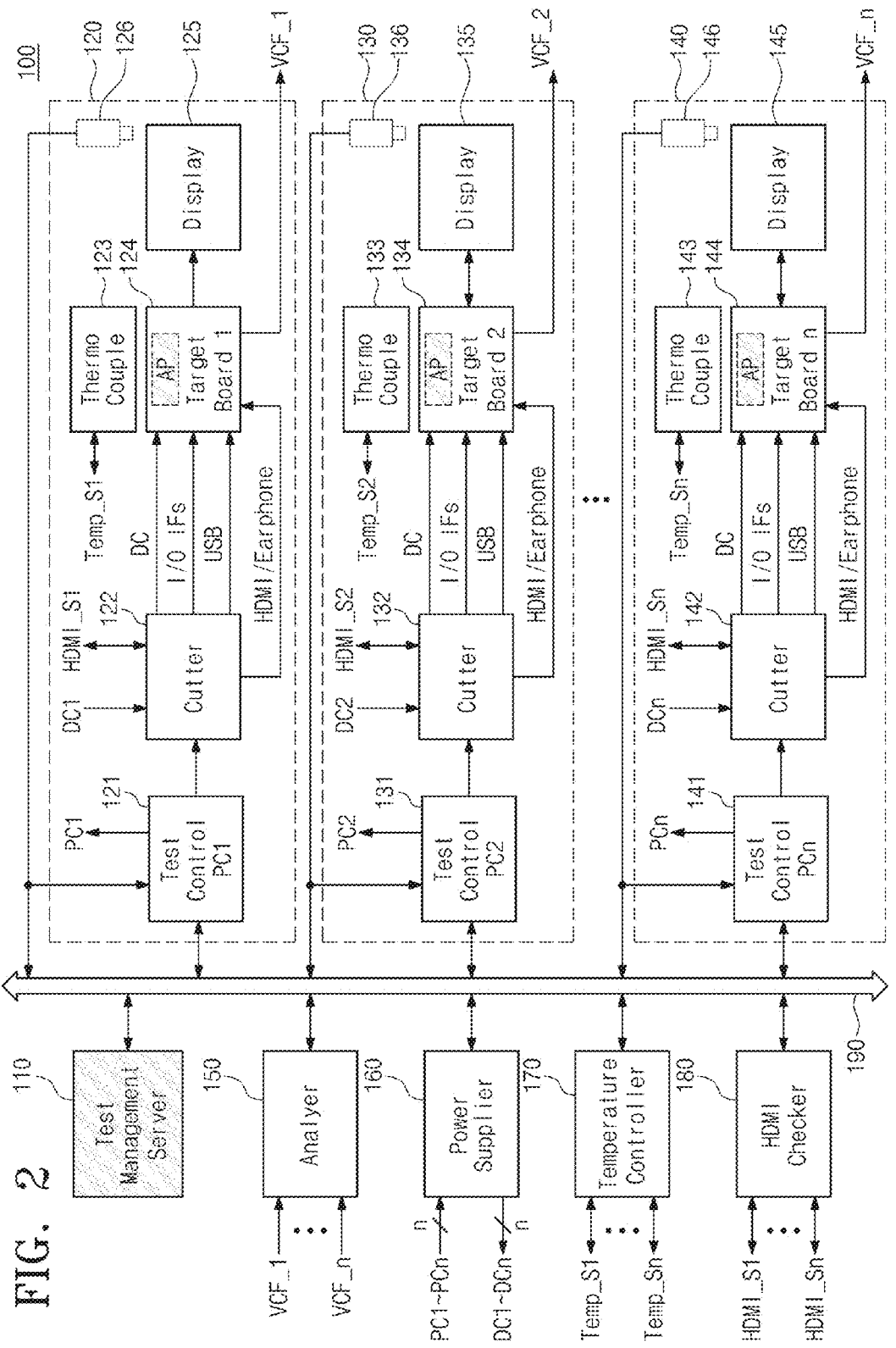
FIG. 2 is a block diagram illustrating a test system 100 in accordance with an exemplary embodiment.

FIG. 2 is a block diagram illustrating a test system 100 according to an exemplary embodiment. Referring to FIG. 2, the test system 100 may include a test management server 110, a plurality of test units 120, 130, and 140 respectively capable of independently testing one application processor, an analyzer 150, a power supplier 160, a temperature controller 170, and an HDMI checker 180. Through a data line 190, the constituent elements described above can be electrically connected to one another and can exchange data with one another.

The test management server 110 establishes (e.g., determines or provides) a test schedule for performing a software test and controls the test units 120, 130, and 140 to perform the established test schedule. The test management server 110 selects various test cases (TC) and can control the test units 120, 130 and 140 so that a software test with respect to an application processor (AP) is executed according to the selected TC. The test management server 110 can provide a test item for applying at least one of a temperature and a voltage stress with respect to an AP to the test units 120, 130, and 140. The test management server 110 may provide, to the test units 120, 130, and 140, various test vectors, sample image data, sample audio data, etc., for testing an operation of an AP. The test management server 110 can control the power supplier 160 so that a corresponding voltage or current level is generated based on the selected TC.

The test management server 110 can receive, from the analyzer 150, analysis data based on a measurement signal from the test units 120, 130 and 140 to display the analysis data on a screen. The test management server 110 can be provided with measurement information provided from the temperature controller 170 and the HMDI checker 180. A test result and information about a state collected in the test management server 110 may be displayed to a user (e.g., manager) through a monitor. TCs selected by a manager through the test management server 110 may be provided to corresponding test units 120, 130 and 140.

The test units 120, 130, and 140 test an AP being built or included in each of target boards 124, 134, and 144 according to a control of the test management server 110. Each of the test units 120, 130 and 140 can perform an independent test operation. The test units 120, 130 and 140 may have a same structure. Thus, a structure and an operation of the test unit 120 will be exemplarily described below.

The test unit 120 includes a test control PC1 121, a cutter 122, a thermo couple 123, a target board1 124, a display 125, and a camera 126. The target board1 124 is fitted with an AP to be tested. The thermo couple 123 may be provided as a part of a socket attaching and detaching an AP. The thermo couple 123 is not electrically connected to the target board1 124 but is thermotically relevant with the target board1 124.

The test control PC1 121 performs a software test with respect to an AP being built or included in the target board1 124 according to a request from the test management server 110. The test control PC1 121 can perform a booting and a power test with respect to a test target AP according to the TC selected by the test management server 110. The test control PC1 121 can select or test various interfaces for communication with an AP being built or included in the target board1 124. The test control PC1 121 tests a temperature characteristic of an AP and receives a test result. To perform all or a plurality of the test cases, the test control PC1 121 can control the cutter 122 and the temperature controller 170.

The cutter 122 controls a supply voltage DC1 and an input/output interface according to a control of the test control PC1 121. For example, the cutter 122 switches a direct voltage DC1 being provided from the power supplier 160 according to a control of the test control PC1 121. The direct current DC1 may be a voltage of a level selected according to the TC. For example, to test performance of a low battery, the direct voltage DC1 may be provided at a relatively low level. The direct voltage DC1 may be provided at a voltage being changed according various scenarios or an unstable voltage for a power test. The cutter 122 may transmit the direct voltage DC1 that is periodically turned on/off to the target board 124 under the control of the test control PC1 121.

The cutter 122 can transmit various test vectors to the target board1 124 through an input/output interface. To test a HDMI interface, the cutter 122 can change test data with the target board1 124. A test result of the HDMI interface is detected through the HDMI checker 180 connected to the cutter 122 and a detection result is provided to at least one of the test control PC1 121 and the test management server 110. The test data with respect to the HDMI interface can be exchanged with the HDMI checker 180 as HDMI test data HDMI_S1.

Furthermore, the cutter 122 can perform one or more tests with respect to various interfaces such as a USB interface, an audio jack. While it has been described herein that the cutter 122 performs a test on a wired interface, it is understood that one or more other exemplary embodiments are not limited thereto. For example, the cutter 122 can perform a test with respect to a wireless communication such as a Bluetooth and a WiFi or various wireless interfaces such as near field communication, radio frequency (RF) communication, ZigBee communication, infrared communication, etc.

The thermo couple 123 tests temperature performance of an AP. The thermo couple 123 can apply a temperature stress (e.g., 85° C.) to an AP mounted on the target board1 124 according to a control of the test control PC1 121. The temperature stress may be a fixed value or a high temperature being changed over time. The thermal couple 123 may include at least one of a thermal element and a cooling element to provide a high or low temperature environment. While a temperature stress is applied, at least one of a voltage, a current, and a driving frequency of an AP is measured through the target board1 124 to be transmitted to the analyzer 180. Driving temperature information of the AP measured by the thermo couple 123 is transmitted to the temperature controller 170.

The thermo couple 123 can sense a temperature change according to various operation modes being provided through the cutter 122 without an artificial driving temperature change. For example, the thermo couple 123 senses a temperature change according to a dynamic voltage and frequency scaling (DVFS) mode and can provide data that may be used to determine whether a normal thermal throttling is performed.

The target board1 124 may be produced to have the same or similar constitution and function as a PCB substrate in which an AP is being built. The target board1 124 includes various input/output interfaces and/or various data exchange interfaces according to various communication standards through the cutter 122. The target board1 124 may include a power supply receiving unit (e.g., power supply receiver) being provided with a voltage from the cutter 122.

The target board1 124 may include a socket fitted with an AP. An upper part of the socket fitted with an AP may be provided as the thermo couple 123. That is, an application processor socket may be provided as a structure capable of providing a measurement of a driving temperature of an AP and a temperature stress. The application processor socket may include a lower part in which an AP is electrically connected to the target board1 124 and an upper part for performing a temperature test while fixing an AP. An upper part of the application processor socket may include the thermo couple 123 and the thermo couple 123 is thermotically connected to the AP. The target board1 124 may include a hardware display driver for controlling the display 125 according to a control of the AP.

The display 125 displays an image provided from an image processor being driven in the AP. An image displayed on the display 125 is sensed or captured by the camera 126 and the image sensed by the camera 125 is transmitted to the test control PC1 121 or the test management server 110. The image provided by the camera 125 may be displayed on any one display device assigned from a plurality of display devices located at the screen unit 10 described above with reference to FIG. 1. A test situation and an image being displayed on the display 125 may be displayed at the same time or substantially simultaneously on a screen assigned to each AP of the screen unit 110.

The remaining test units 130 and 140 corresponding to each of the APs being tested at the same time may be constituted to in the same or similar manner as the first test unit 120. The test unit 130 includes a test control PC2 131, a cutter 132, a thermo couple 133, a target board2 134, a display 135, and a camera 136. The test unit 140 includes a test control PCn 141, a cutter 142, a thermo couple 143, a target boardn 144, a display 145, and a camera 146. However, a test procedure of each of the test units 120, 130 and 140 may be independently performed and controlled.

The analyzer 150 is provided with measurement voltages VCF_1, VCF_2, . . . , VCF_n from the target boards 124, 134 and 144 of the test units 120, 130 and 140. The measurement voltages VCF_1, VCF_2, . . . , VCF_n may be a power supply voltage level of each AP in various driving conditions provided by the cutter 122. The analyzer 150 may analyze at least one of a driving frequency and a power consumption characteristic of each application processor based on the measurement voltages VCF_1, VCF_2, . . . , VCF_n to provide the analysis result to the test management server 110. The measurement voltages VCF_1, VCF_2, . . . , VCF_n may further include at least one of a current and operating frequency information, in addition to or instead of a voltage level.

The power supplier 160 provides direct voltages DC1, DC2 and DCn to the cutters 122, 132 and 142 respectively under the control of the test control PCs 121, 131 and 141. For example, if a test case (TC) is a low battery TC, the power supplier 160 provides a low direct voltage DC to a cutter of a corresponding test unit.

The temperature controller 170 receives temperature information Tem_S1, Tem_S2 and Tem_Sn provided from the thermo couples 123, 133 and 143 included in the test units 120, 130 and 140. The temperature controller 170 provides the received temperature information to respective test control PCs 121, 131 and 141 or the test management server 110. Each of the temperature information Tem_S1, Tem_S2 and Tem_Sn may include at least one of a measurement temperature and temperature control information. The temperature control information represents the degree of temperature stress being applied by a heating element of each of the thermo couples 123, 133 and 143.

The HDMI checker 180 can detect a signal of a HDMI interface connected to each of the cutters 122, 132 and 142 and judge or determine whether an error occurs. For example, the HDMI checker 180 may check HDMI interfacing performance through a data exchange to determine whether or not there is a problem in an image data transfer to a frame buffer of an AP. The HDMI checker 180 detects whether errors exist by transmitting test data being provided to the cutters 122, 132 and 142 to corresponding APs. A verify operation of the HDMI checker 180 is performed by test data HDMI_S1, HDMI_S2 and HDMI_Sn being exchanged between the cutter 122 and the HDMI checker 180.

To perform various types of test items, various interfaces or various characteristics may be included in a constitution of the test system 100. According to the test system 100 of the present exemplary embodiment, a software test of at least two APs may proceed at high speed. Fails of an AP can be detected at high speed in a driving situation of software by consecutively applying various test cases.

Figure 3:
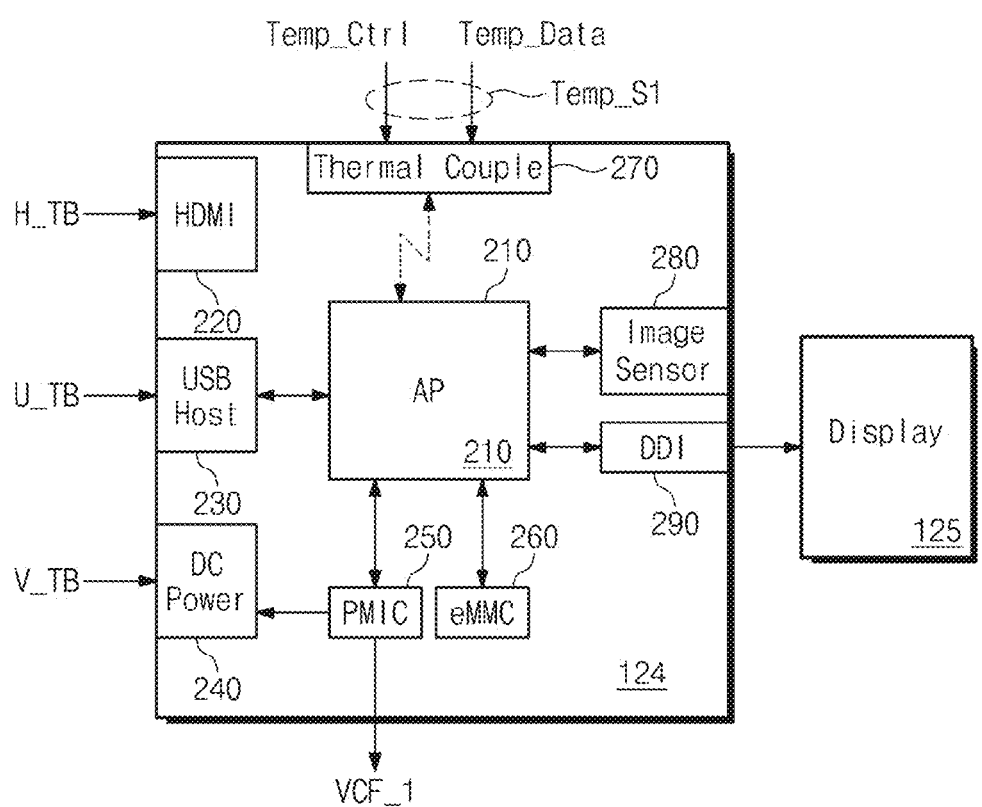
FIG. 3 is a block diagram illustrating a target board 1 of FIG. 2.

FIG. 3 is a block diagram illustrating a target board 1 124 of FIG. 2. Referring to FIG. 3, the target board1 124 may include an application processor 210, a HDMI interface 220, a USB host interface 230, a DC power input stage 240, a power management integrated circuit (IC) 250, an embedded Multi-Media Controller (eMMC) 260, a thermo couple 270, an image sensor 280, and a display driver IC 290.

The application processor 210 may be built or included in a socket included in the target board1 124. The socket may include a first part (e.g., lower part) in which various connection units are electrically connected to the target board1 124 and a second part (e.g., an upper part) capable of applying a temperature stress or measuring a driving temperature while fixing the application processor 210. The upper part of the socket may be constituted by or include the thermo couple 270. Thus, it is possible to apply a temperature stress to the application processor 210 and measure a temperature of the application processor 210 under various driving conditions.

The HDMI interface 220 can transmit a HDMI signal H_TB being provided from the cutter 122 to the application processor 210. Additionally, the HDMI interface 220 can transmit a HDMI signal H_TB being provided from the application processor 210 to the cutter 122. The HDMI checker 180 is connected to the cutter 122 and thereby HDMI data exchange performance of the application processor 210 can be measured.

The USB host interface 230 can transmit various USB test signals being provided through the cutter 122 to the application processor 210. Additionally, the USB host interface 230 can transmit a USB signal being output from the application processor 210 to the cutter 122. The test control PC1 121 can measure USB interfacing performance of the application processor 210 with reference to a USB signal being provided through the cutter 122.

The DC power input stage 240 receives a DC voltage V_TB being provided from the power supplier 160. The DC power input stage 240 provides the received DC voltage to the power management IC 250.

The power management IC 250 transmits a voltage from the DC power input stage 240 to the application processor 210. The power management IC 250 in a specific test mode can directly transmit a voltage provided from the DC power input stage 240 to the application processor 210 without regulation. The power management IC 250 can provide a power supply stage of the application processor 210, a voltage at a specific node, or a current to the analyzer 150 in real time. The embodied memory eMMC 260 provides a nonvolatile memory for the application processor 210.

The thermo couple 270 may include a temperature sensor for measuring a temperature and a heating unit (e.g., heater, heating element, etc.) for providing a temperature stress. The thermo couple 270 can increase a peripheral temperature of the application processor 210 according to a temperature control signal Temp_Ctrl. The thermo couple 270 measures a driving temperature of the application processor 210 to generate the measured driving temperature as temperature data Temp_Data.

The image sensor 280 may be provided as a camera module or camera. The display driver IC 290 is a control unit (e.g., controller) for driving a display device in which information is displayed by the application processor 210.

Through a constitution of the target board 124, the application processor 210 can be easily mounted and a temperature test of applying a temperature stress can be performed.

A constitution of the target board1 124 shown in FIG. 3 is only illustrative, and it is understood that various constitutions may be included in the target board1 124 according to various communication standards and/or one or more other exemplary embodiments.

Figure 4:
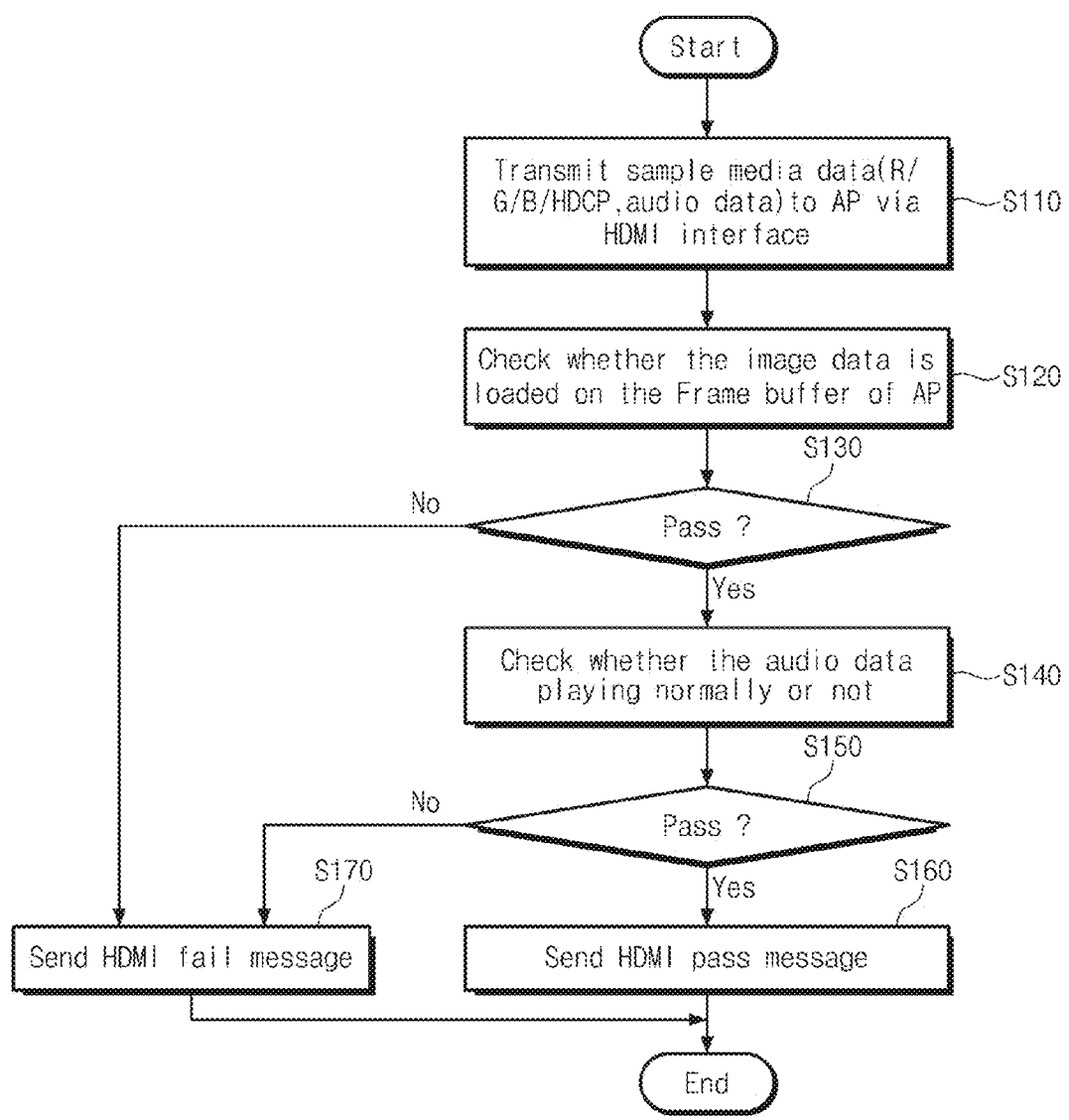
FIG. 4 is a flowchart illustrating a method of testing High-Definition Multimedia Interface (HDMI) interfacing performance of an application processor in accordance with an exemplary embodiment.

FIG. 4 is a flowchart illustrating a method of testing HDMI interfacing performance of an application processor (AP) in accordance with an exemplary embodiment. Referring to FIG. 4, a HDMI test operation being performed by the HDMI checker 180 and each of the test units will be described. For convenience of description, a HDMI test procedure will be described using the AP being tested in the test unit 120 of FIG. 2 as an illustration.

In operation S110, the test control PC1 121 controls the cutter 122 so that sample media data (e.g., R/G/B/High-bandwidth Digital Content Protection (HDCP), audio data, etc.) is transmitted to an AP according to a test case (TC) provided from the test management server 110. The cutter 122 transmits sample media data from the test control PC1 121 to the AP built or included in the target board1 124 through a HDMI interface. Image data transmitted to the AP is loaded on a frame buffer.

In operation S120, the cutter 122 requests the image data loaded on the frame buffer of the AP according to a control of the test control PC1 121. Then, the AP transmits the image data to the cutter 122 through the HDMI interface. The HDMI checker 180 detects whether the transmitted image data is normal or not to verify performance of the HDMI interface.

In operation S130, an operation branch is performed according to a verification result by the HDMI checker 180. If the HDMI checker 180 judges (e.g., determines) that the image data is normal (Yes), the procedure proceeds to operation S140. If the HDMI checker 180 judges that there is a problem in sample data exchanged through the HDMI interface (No), the procedure proceeds to operation S170.

In operation S140, the cutter 122 requests audio data provided to an audio system of the AP according to a control of the test control PC1 121. The AP transmits audio data to the cutter 122 through the HDMI interface. The HDMI checker 180 detects whether the transmitted image data is normal to verify performance of the HDMI interface.

In operation S150, an operation branch is performed according to a verification result by the HDMI checker 180. If the HDMI checker 180 judges (e.g., determines) that the audio data is normal (Yes), the procedure proceeds to operation S160. If the HDMI checker 180 judges that there is a problem in sample audio data exchanged through the HDMI interface (No), the procedure proceeds to operation S170.

In operation S160, the HDMI checker 180 transmits, to at least one of the test management server 110 and the test control PC1 121, a pass message notifying that a HDMI interfacing operation of the AP is normal.

In operation S170, the HDMI checker 180 transmits, to at least one of the test management server 110 and the test control PC1 121, a fail message notifying that a HDMI interfacing operation of the AP is abnormal. The test result may be displayed on the screen unit 10 (refer to FIG. 1) being displayed by the test control PC1 121.

Figure 5:
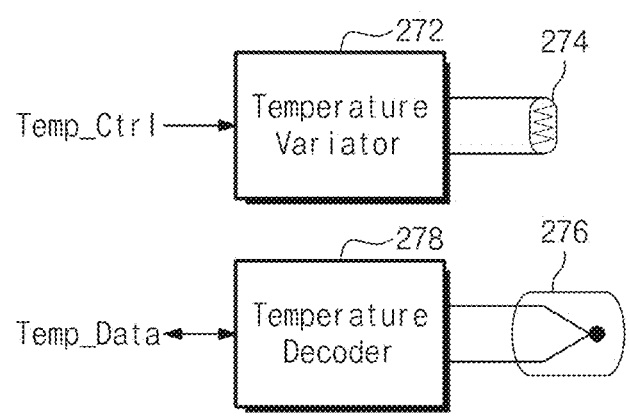
FIG. 5 is a block diagram illustrating a constitution of a thermal couple 270 of FIG. 3.

FIG. 5 is a block diagram illustrating a constitution of a thermal couple 270 of FIG. 3, according to an exemplary embodiment. Referring to FIG. 5, the thermo couple 270 includes a temperature variator 272, a heating element 274, a temperature sensor 276, and a temperature decoder 278.

The temperature variator 272 can control the heating element 274 according to a control of a temperature control signal Temp_Ctrl provided from the test control PC1 121 or the temperature controller 170 (refer to FIG. 2). The temperature control signal Temp_Ctrl may be binary data or an analog signal directing a temperature level. The temperature variator 272 controls an electrical signal provided to the heating element 274 according to the temperature control signal Temp_Ctrl.

The heating element 274 generates heat according to a control of the temperature variator 272. The heating element 274 may be constituted by a resistive material converting an electrical energy provided from the temperature variator 272 into heating energy. The heating element 274 may be constituted by or include a cooling element absorbing circumjacent heat. For example, the heating element 274 constituted by a cooling element can lower a surface temperature of the application processor 210 below minus 40 degrees. That is, the heating element 274 may provide a high temperature stress or a low temperature stress.

The temperature sensor 276 senses a driving temperature of the AP to provide the sensed driving temperature as an electrical signal. For example, a thermo electromotive force type sensor (or thermocouple) using an electromotive force that changes with temperature and a thermal conductive type sensor sensing a resistance value that changes with temperature may be used as the temperature sensor 276. However, it is understood that a temperature measurement method of the temperature sensor 276 is not limited thereto in one or more other exemplary embodiments.

The temperature decoder 278 converts a sensing signal of an analog type provided from the temperature sensor 276 into digital data. The temperature data converted into digital data is then transmitted to the temperature controller 170 and the test control PC1 121.

Figure 6:
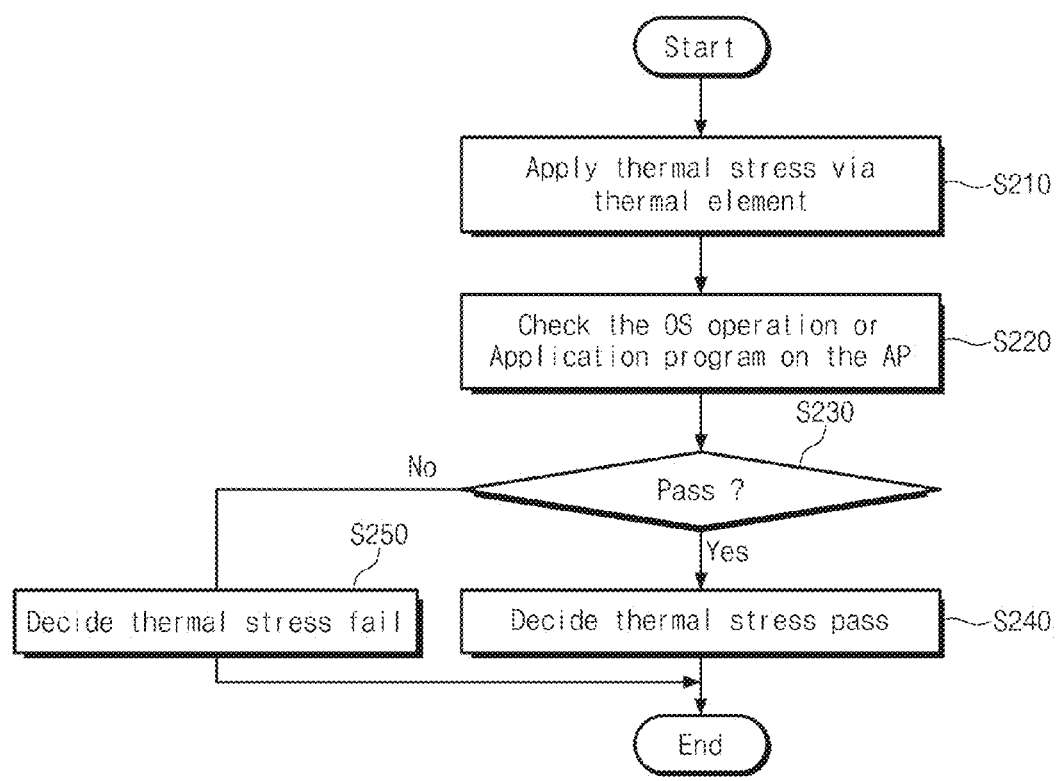
FIG. 6 is a flowchart illustrating a temperature stress test method of an application processor in accordance with an exemplary embodiment.

FIG. 6 is a flowchart illustrating a temperature stress test method of an application processor in accordance with an exemplary embodiment.

For purposes of describing an exemplary embodiment, it is exemplarily assumed in the following description that a heat-generating temperature being provided to an application processor (AP) for a temperature stress is about 85° C.

In operation S210, a specific test control PC provides a temperature control signal Temp_Ctrl to the thermo couple 270 according to a test case (TC) provided from the test management server 110. If a temperature control signal Temp_Ctrl is provided by the test control PC1 121, a heat generation begins by the temperature variator 272 of the thermo couple 270. A temperature of the AP rises to about 85° C. by the heating element 274.

In operation S220, an operation frequency and a level of a driving voltage of the AP are detected or determined. Various APs may be driven under the temperature stress and a multitasking for constituting the worst drive environment may be performed in the AP. The analyzer 150 measures at least one of a voltage and frequency being output to provide the measured voltage and/or frequency to the test control PC1 121.

In operation S230, the test control PC1 121 corresponding to the AP being tested judges (e.g., determines) whether an operation of the AP with respect to the temperature stress is normal with reference to information from the analyzer 150. If it is judged that an operation of the AP under the temperature stress is normal (Yes), the procedure proceeds to operation S240. If it is judged that an operation of the AP under the temperature stress is abnormal (No), the procedure proceeds to operation S250.

In operation S240, the test control PC1 121 judges (e.g., determines) a result of the temperature stress test to be a pass. In operation S250, the test control PC1 121 judges a result of the temperature stress test to be a fail. The test result may be displayed on the screen unit 10 (refer to FIG. 1) by the test control PC1 121.

Figure 7:
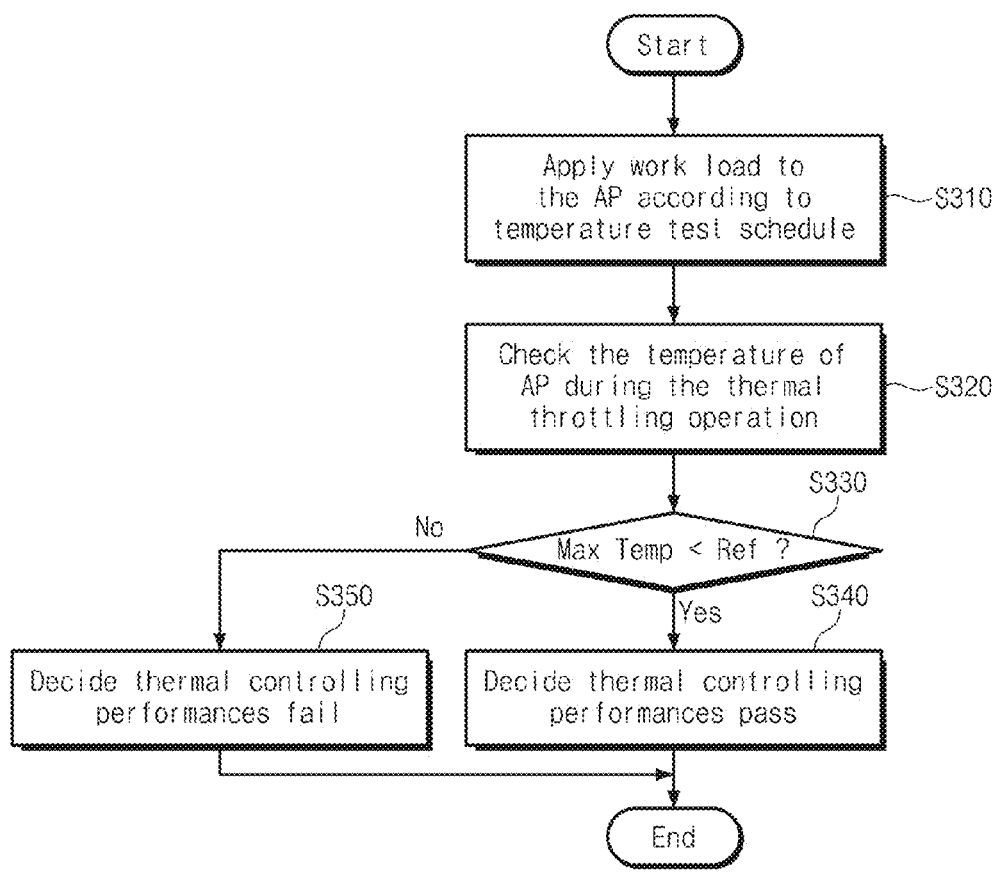
FIG. 7 is a flowchart illustrating a temperature test in accordance with an exemplary embodiment.

FIG. 7 is a flowchart illustrating a temperature test in accordance with an exemplary embodiment. Referring to FIG. 7, the test system 100 can test whether a thermal throttling being proceeded according to a work load of the application processor (AP) is normally proceeded.

In operation S310, the test control PC1 121 provides a work load to test a thermal throttling of the AP itself according to a test case (TC) provided from the test management server 110. For example, the test control PC can transmit a work request including the greatest occurrence of arithmetic operation to the AP. An operation temperature may rise depending on an operation of the AP.

In operation S320, a temperature of the AP is measured by a temperature sensor built or included in the target board1 124 and the measurement result is transmitted to the temperature controller 170. If various work loads are provided to the AP, a thermal throttling of the AP is activated. In case of a normal thermal throttling operation, if it is judged (e.g., determined) that an operation temperature excessively rises, the AP reduces a processing speed of the requested work or strengthens a driving voltage. Through those operation controls, heat-generation can be reduced and an operation temperature can be lowered.

In operation S330, the temperature controller 170 compares a measured maximum temperature Max_Temp with a reference temperature Ref. If the maximum temperature Max_Temp is lower than the reference temperature Ref (Yes), the procedure proceeds to operation S340. If the maximum temperature Max_Temp is higher than the reference temperature Ref (No), the procedure proceeds to operation S350.

In operation S340, the test control PC1 121 judges (e.g., determines) a result of thermal throttling of the AP to be a pass. In operation S350, the test control PC1 121 judges a result of thermal throttling of the AP to be a fail. The test result may be displayed on the screen unit 10 (refer to FIG. 1) by the test control PC1 121.

Figure 8:
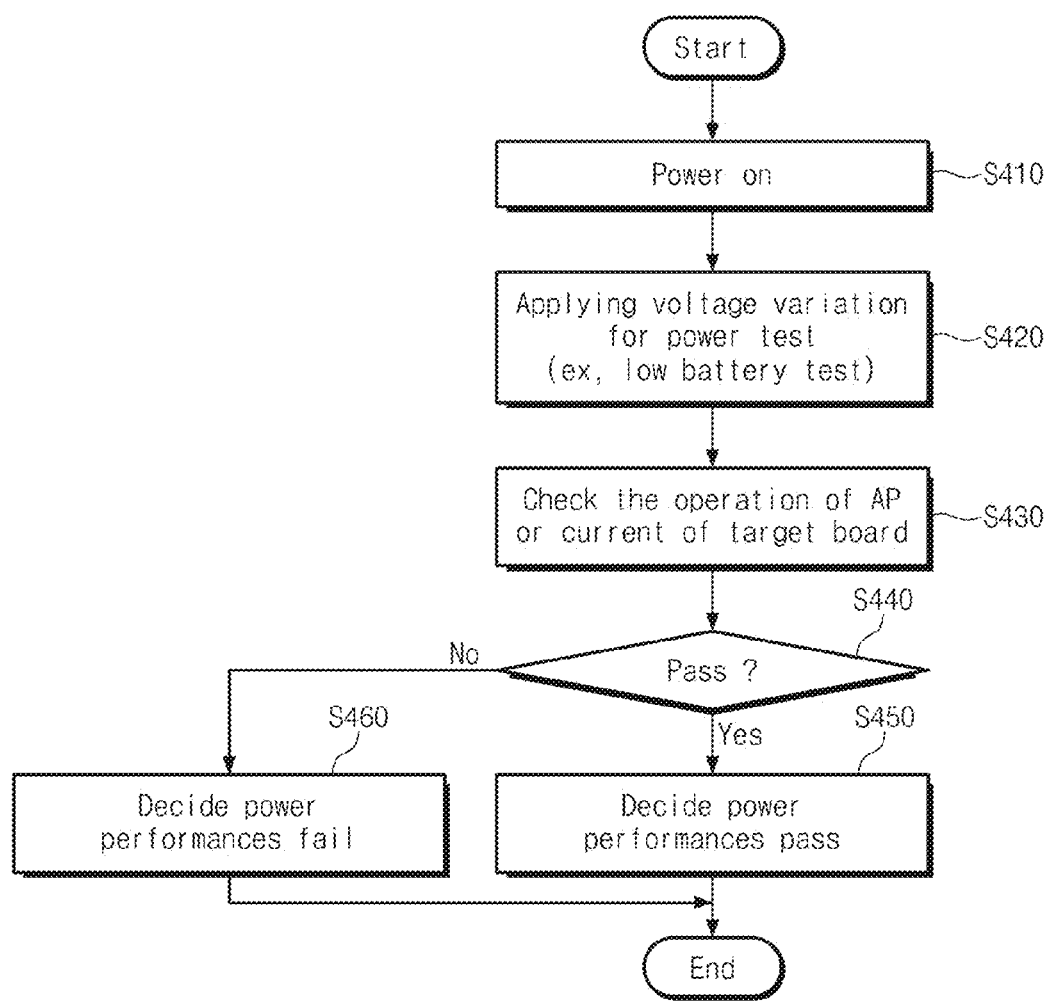
FIG. 8 is a flowchart illustrating a method of testing a low battery characteristic among test items included in a test case in accordance with an exemplary embodiment.

FIG. 8 is a flowchart illustrating a method of testing a low battery characteristic among test items included in a test case (TC) in accordance with an exemplary embodiment. Referring to FIG. 8, an operation characteristic of the application processor (AP) is measured in a low battery state through a target board and it may be judged whether the AP normally operates or not using measured various data combinations.

In operation S410, the test control PC1 121 tests a voltage characteristic of the AP according to a TC provided from the test management server 110. A sudden power off characteristic or other scenarios or characteristics testing reliability of an AP when a power supply voltage excessively rises or drops may be included in various voltage characteristics. To measure a characteristic in a low battery, the test control PC1 121 provides a voltage to the target board1 124 through the cutter 122.

In operation S420, the test control PC1 121 can change a direct current level being provided to the target board1 124 through the cutter 122. For example, to test a low battery characteristic, the cutter 122 can control a direct current to a level lower than a normal operation voltage.

In operation S430, various characteristics (e.g., at least one of an operation current, an operation voltage, an operation frequency, etc.) being measured through the target board1 124 may be provided to the analyzer 150. Through the display 125, it can be checked whether an operation such as a warning message output, a backup operation, an auto power-off, etc., are normally performed in a low battery situation. That operation can be checked through an image of the display 125 being provided to the screen unit 10 through a camera 70.

In operation S440, the test control PC1 121 judges a test result with respect to a low battery characteristic on the basis of the measured data. If a result of a low battery test is judged (e.g., determined) to be a normal (Yes), the procedure proceeds to operation S450. If a result of a low battery test is judged to be an abnormal (No), the procedure proceeds to a step S460.

In operation S450, the test control PC1 121 judges (e.g., determines) a low battery characteristic of the AP to be normal (Pass). In operation S460, the test control PC1 121 judges a low battery characteristic of the AP to be abnormal (Fail). The test result may be displayed on the screen unit 10 (refer to FIG. 1) by the test control PC1 121.

Figure 9:
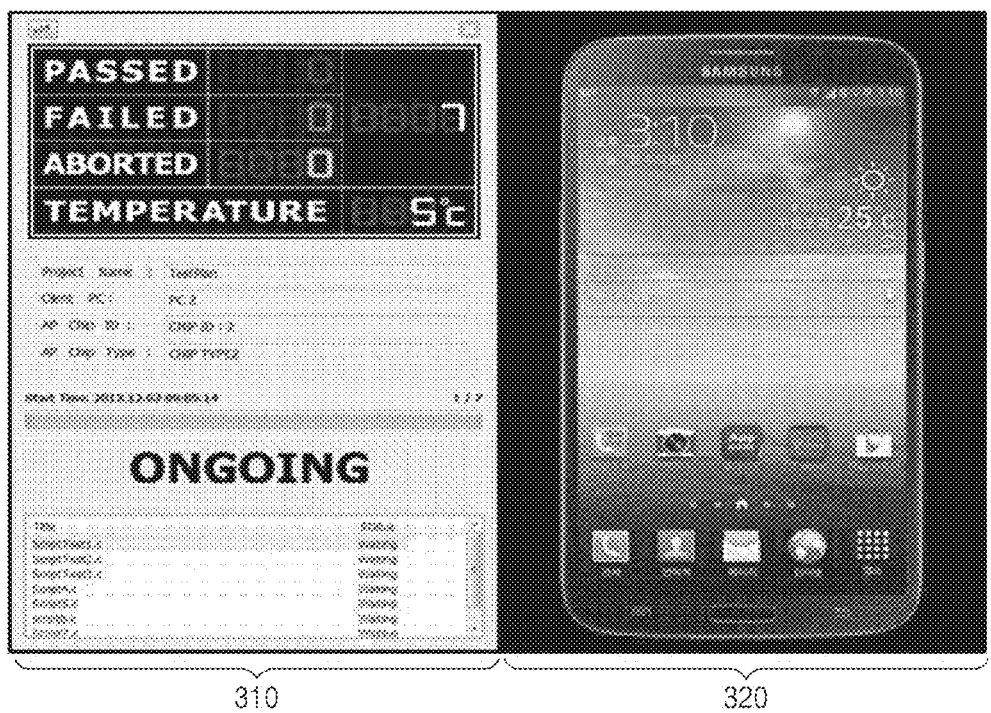
FIG. 9 is a drawing illustrating a part of screen unit illustrated in FIG. 1.

FIG. 9 is a drawing illustrating a part of screen unit 10 illustrated in FIG. 1, according to an exemplary embodiment.

Referring to FIG. 9, any one screen 300 of the screen unit 10 includes a first part 310 illustrating a progress of a software operation, a temperature, and a test result of an application processor (AP), and a second part 320 illustrating the display 125 shot through a camera.

The first part 310 may display a test progress by the test control PC1 121. That is, a list of items that a test is completed and items that a test is not completed among various test items constituting a test case can be checked. The first part 310 may display a driving temperature of an AP measured in the target board 124.

The second part 320 displays an image of the display 125 captured through a camera in real time. Displaying an image of the display 125 can provide a means to check a defect that is difficult to electrically sense.

FIG. 10 is a table illustrating test cases being applied to a software test with respect to one application processor (AP) in a test system according to an exemplary embodiment. Referring to FIG. 10, the type of test may be classified into a pattern DVFS, voltage/current/frequency, a function test, stability, a benchmark test, etc.

The pattern DVFS is a plurality of test cases for verifying various DVFS tables in an AP. Each test case corresponds to various cases for testing a voltage level change to support an optimum operation according to a frequency change of a central processing unit (CPU) included in the AP. Four test cases are included in the pattern DVFS as an illustration, although it is understood that one or more other exemplary embodiments are not limited thereto.

The voltage/current/frequency test may test whether a change of voltage/current/frequency is measured under the various driving conditions and whether a range of the measured change is within an allowable range. The voltage/current/frequency test may be constituted by various scenarios. The number of test cases testing the voltage/current/frequency is illustrated to be 1 and required time is about 20 minutes, although it is understood that one or more other exemplary embodiments are not limited thereto.

The function test is a test testing whether function blocks performing a specific function are normal or not. The function test can test a specific function of each of various function blocks IPs included in an AP. For example, to test a function of an image processing, a transmission and a processing operation of various image files may be tested. The number of test cases for testing the function blocks may be 17. It takes about 60 minutes to perform total test cases.

However, it is understood that one or more other exemplary embodiments are not limited thereto.

In the stability test, it is tested whether an operating system (OS) normally operates by providing various operation environments while the operating system is driven. For example, it can be tested whether a booting is normally performed and an audio or video play is normally performed. The stability test includes a monkey test in which a random event occurs. Through various test cases, it can be tested whether a file system, a bit/little switching, a memory, a camera test, etc., maintain a stable operation under the severe condition. The benchmark includes cases of testing a performance of an AP under various conditions.

The test system 100 according to an exemplary embodiment may implement the test cases as described above to test each of plural APs.

Figure 11:
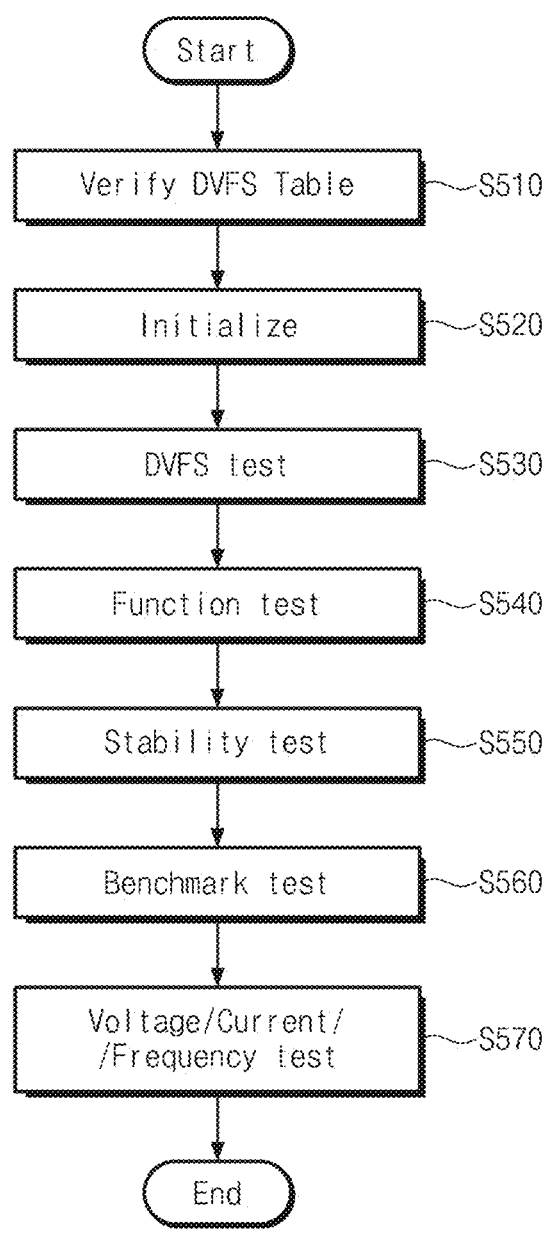
FIG. 11 is a flowchart illustrating an execution method of an intelligent test case in accordance with an exemplary embodiment.

FIG. 11 is a flowchart illustrating an execution method of an intelligent test case in accordance with an exemplary embodiment. Referring to FIG. 11, the test system 100 sequentially tests application processors (APs) built in a target board according to a test case which is set.

In operation S510, the test system 100 verifies a DVFS table defined in a test case. The test system 100 checks (e.g., determines) whether a frequency of an AP normally increases according to an operation level defined in the DVFS table.

In operation S520, an initialization is performed on the test system 100. That is, it is checked (e.g., determined) whether the test units 120, 130 and 140 normally operate. It is also checked whether the power supplier 160 providing a test pattern, the temperature controller 170, the HDMI checker 180, and the cutters 122, 132, and 142 normally operate.

In operation S530, a DVFS test is performed on APs built or included in each of the test units 120, 130, and 140. The DVFS test is a test testing whether an AP normally operates while randomly changing various operation environments prescribed in the DVFS table. For example, it may be tested whether software of an AP normally responds or executes while changing an operation frequency from the maximum value to the minimum value.

In operation S540, a function test is performed by each of the test units 120, 130, and 140. For example, a test is performed on each of function blocks IPs. To perform a function test, a test control PC can activate a specific application program to an AP. It can be detected through that function test whether a function of various function blocks is activated at an appropriate time.

In operation S550, a stability test is performed. To perform the stability test, at least one of a booting of an AP, an audio or video play, a monkey test, a file system, a memory, a camera, a switch operation of a multi core CPU, etc., may be tested.

In operation S560, a benchmark test is performed. Using a benchmark tool, a test control PC can verify a CPU, a memory, graphic performance, and file system performance.

In operation S570, a voltage/current/frequency test may be performed.

According to one or more exemplary embodiments, a test system capable of automatically performing a software test on a plurality of system on chips and a test method thereof are provided. Thus, according to the test system, since it can be tested whether the system on chips normally operate by independently applying various test cases to the system on chips, time and cost required for the software test can be greatly reduced.

The foregoing is illustrative of exemplary embodiments and is not to be construed as limiting thereof. Although a few exemplary embodiments have been described, those skilled in the art will readily appreciate that many modifications are possible in exemplary embodiments without materially departing from the novel teachings and advantages of the present inventive concept. Accordingly, all such modifications are intended to be included within the scope of the present invention as defined in the claims. The present invention is defined by the following claims, with equivalents of the claims to be included therein.

What is claimed is:

1. A test system for testing a plurality of system on chips, the test system comprising:
   a plurality of test units configured to test the plurality of system on chips according to a plurality of test cases, respectively;
   a power supplier configured to supply, to each of the plurality of test units, power of a level corresponding to a corresponding test case, among the plurality of test cases;
   a temperature controller configured to provide, to each of the plurality of test units, a temperature control signal according to the corresponding test case, and to monitor a measurement temperature, provided from each of the plurality of test units, of each of the plurality of system on chips; and
   an analyzer configured to analyze at least one of a driving voltage, a driving current, and a driving frequency of each of the plurality of system on chips, provided from each of the plurality of test units,
   wherein each of the plurality of test units determines whether software driven in any of the plurality of system on chips is defective based on respective test results with respect to the plurality of system on chips.

2. The test system of claim 1, wherein each of the plurality of test units comprises:
   a target board including a system on chip, among the plurality of system on chips, being tested;
   a cutter configured to directly or variably provide the power to the system on chip through the target board and is connected to the system on chip through one or more input/output interfaces; and
   a test control personal computer (PC) configured to control the power supplier according to the corresponding test case and to provide, through the cutter, the power and data being exchanged through the one or more input/output interfaces by an operation corresponding to the corresponding test case.

3. The test system of claim 2, wherein each of the plurality of test units further comprises a thermo couple configured to provide a temperature stress on the system on chip included in the target board according to a temperature control signal provided from the temperature controller.

4. The test system of claim 3, wherein the thermo couple is configured to measure a driving temperature of the system on chip to provide the measured driving temperature to the temperature controller.

5. The test system of claim 3, wherein the thermo couple comprises:
   a heating element configured to provide a temperature stress on a surface of the system on chip according to the temperature control signal; and
   a temperature sensor configured to measure a driving temperature of the system on chip.

6. The test system of claim 5, wherein each of the plurality of test units further comprises a display which is connected to the target board and is configured to display an image output by the system on chip.

7. The test system of claim 6, wherein each of the plurality of test units further comprises a camera configured to capture the image displayed by the display to provide the captured image to the test control PC.

8. The test system of claim 2, further comprising a High-Definition Multimedia Interface (HDMI) checker configured to test, for each of the plurality of test units, a HDMI interface and data processing performance of the system on chip according to a request of the test control PC.

9. The test system of claim 8, wherein, according to the request of the test control PC, the HDMI checker is configured to provide test data to the cutter and is provided with a test result from the cutter to determine the HDMI interface and data processing performance.

10. The test system of claim 9, wherein the test control PC is configured to determine, based on data provided from the HDMI checker, the analyzer, and the temperature controller, a software driving performance of the system on chip being tested.

11. The test system of claim 10, further comprising a screen configured to visually display a test result verified by the test control PC.

12. The test system of claim 1, further comprising a test management server configured to assign a test case to each of the plurality of test units and to collect test data about the plurality of system on chips being tested with reference to data provided from each of the plurality of test units.

13. A test system for testing software of a plurality of system on chips, the test system comprising:
a plurality of test units configured to simultaneously test the plurality of system on chips, respectively, by independently applying a plurality of test cases,
wherein each of the plurality of test units comprises:
a target board including a system on chip, among the plurality of system on chips, being tested;
a cutter configured to regulate power, supplied to the test unit, according to a corresponding test case among the plurality of applied test cases, and to provide the regulated power to the system on chip through the target board; and
a test controller configured to control a regulating operation of the cutter according to the corresponding test case, and to exchange data with the system on chip through the cutter.

14. The test system of claim 13, further comprising a test management server configured to provide the plurality of test cases to the plurality of test units, respectively.

15. The test system of claim 13, wherein:
the cutter is connected to the system on chip through at least one input/output interface; and
the test controller applies, to the system on chip through the cutter, a workload according to the corresponding test case.

16. The test system of claim 15, wherein, according to a control of the test controller, the cutter tests a processing performance of the at least one input/output interface.

17. The test system of claim 13, wherein each of the plurality of test units further comprises a thermo couple configured to provide a temperature stress on the system on chip according to a corresponding temperature control signal, from among a plurality of temperature control signals independently applied to the plurality of test units, respectively, according to the plurality of test cases.

18. The test system of claim 13, wherein the plurality of test units are configured to determine, based on the applied plurality of test cases, respective software driving performances of the plurality of system on chips.

19. The test system of claim 13, further comprising:
a power supplier configured to supply, to each of the plurality of test units, power of a level corresponding to the corresponding test case;
a temperature controller configured to provide, to each of the plurality of test units, a temperature control signal according to the corresponding test case, and to monitor a measurement temperature, provided from each of the plurality of test units, of each of the plurality of system on chips; and
an analyzer configured to analyze at least one of a driving voltage, a driving current, and a driving frequency of each of the plurality of system on chips.

20. A method comprising:
testing, via a plurality of test units, a plurality of system on chips (SOCs) according to a plurality of test cases, respectively;
supplying, to each of the plurality of test units, power of a level corresponding to a corresponding test case, among the plurality of test cases;
providing, to the each of the plurality of test units, a temperature control signal according to the corresponding test case;
monitoring a measurement temperature, provided from the each of the plurality of test units, of each of the plurality of SOCs;
analyzing at least one of a driving voltage, a driving current, and a driving frequency, of the each of the plurality of SOCs, provided from the each of the plurality of test units; and
determining, by each of the plurality of test units, whether software driven in any of the plurality of SOCs is defective, based on respective test results with respect to the plurality of SOCs.

* * * * *